United States Patent
Zhai et al.

(10) Patent No.: US 10,064,305 B1
(45) Date of Patent: Aug. 28, 2018

(54) STANDARD FORM FACTOR ELECTRONIC MODULE CARRIER COMPRISING MULTIPLE SEPARATELY-REMOVABLE SUB-CARRIERS

(71) Applicant: EMC IP Holding Company LLC, Hopkinton, MA (US)

(72) Inventors: Haifang Zhai, Shanghai (CN); Hendry Wu, Shanghai (CN); David Dong, Shanghai (CN); Qingqiang Guo, Shanghai (CN); Yujie Zhou, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/666,820

(22) Filed: Aug. 2, 2017

(30) Foreign Application Priority Data

Jul. 31, 2017 (CN) .......................... 2017 1 0642788

(51) Int. Cl.
*H05K 7/20* (2006.01)
*H05K 7/14* (2006.01)
*H05K 7/18* (2006.01)
*G06F 1/18* (2006.01)

(52) U.S. Cl.
CPC .......... *H05K 7/1427* (2013.01); *G06F 1/183* (2013.01); *H05K 7/1461* (2013.01); *H05K 7/18* (2013.01)

(58) Field of Classification Search
CPC ... H05K 7/1487; H05K 7/1488; H05K 7/1489
See application file for complete search history.

(56) References Cited

U.S. PATENT DOCUMENTS 7,623,356 B2 * 11/2009 Leigh .................. H05K 7/1492
  361/679.01
9,826,657 B2 * 11/2017 Killen ................. H05K 7/1489
(Continued)

FOREIGN PATENT DOCUMENTS

WO     2016018345 A1    2/2016

OTHER PUBLICATIONS

Lindy Connection Perfection, "M.2 SSD to 2.5" SATA Adapter," Part No. 20934, 2017, 1 page.
(Continued)

*Primary Examiner* — Anthony Q Edwards
(74) *Attorney, Agent, or Firm* — Ryan, Mason & Lewis, LLP (57) ABSTRACT

An electronic module carrier in one embodiment comprises a carrier housing having a front portion and a rear portion, and a plurality of sub-carriers configured for separate insertion into and removal from respective sub-carrier slots in the front portion of the carrier housing. Each of the sub-carriers is configured to support at least one non-volatile memory module. The electronic module carrier is configured with a designated standard form factor for insertion into and removal from a carrier slot in a front portion of an electronic equipment chassis. For example, the standard form factor may be a 2.5" storage drive form factor. The non-volatile memory modules may comprise respective flash drives or other types of non-volatile memory modules implemented using an M.2 form factor.

20 Claims, 9 Drawing Sheets

(56) References Cited

U.S. PATENT DOCUMENTS

| | | | | |
|---|---|---|---|---|
| 2013/0229775 A1* | 9/2013 | Crisp | .................. | H05K 7/18 |
| | | | | 361/726 |
| 2013/0335907 A1* | 12/2013 | Shaw | .................... | G06F 1/183 |
| | | | | 361/679.31 |
| 2015/0277512 A1 | 10/2015 | Davis et al. | | |

OTHER PUBLICATIONS

"Dual M.2 NGFF SATA Adapter with RAID," https://www.startech.com/eu/HDD/Adapters/dual-m2-ssd-sata-adapter~25S22M2NGFFR, Jun. 19, 2017, pp. 1-6.
ZTC, "ZTC RAID Series M.2 NGFF to SATA III 2.5-inch Enclosure Board, Supports RAID 0/1, JBOD Speed up to 520MB," https://www.memoryc.com/19772-ztc-raid-series-m-2-ngff-to-sata-iii-2-5-inch-enclosure-b . . . , Jun. 19, 2017, 1 page.
"2x NGFF in 2.5_ SSD," https://www.google.com/blank.html, Jun. 19, 2017, 1 page.

* cited by examiner

STANDARD FORM FACTOR ELECTRONIC MODULE CARRIER COMPRISING MULTIPLE SEPARATELY-REMOVABLE SUB-CARRIERS

FIELD

The field relates generally to electronic equipment, and more particularly to carrier and chassis configurations for such electronic equipment.

BACKGROUND

A given set of electronic equipment configured to provide desired system functionality is often installed in a chassis. Such equipment can include, for example, various arrangements of storage devices, memory modules, processors, circuit boards, interface cards and power supplies used to implement at least a portion of a storage system, a multi-blade server system or other type of information processing system.

The chassis typically complies with established standards of height, width and depth to facilitate mounting of the chassis in an equipment cabinet or other type of equipment rack. For example, standard chassis heights such as 1U, 2U, 3U, 4U and so on are commonly used, where U denotes a unit height of 1.75 inches (1.75") in accordance with the well-known EIA-310-D industry standard.

It is also common for an electronic equipment chassis to be configured to support installation of standard form factor carriers. For example, a given such chassis can be configured to accept standard form factor storage drives, such as 2.5" form factor storage drives. Unfortunately, conventional implementations of such standard form factor storage drives are unduly limited in their configuration and functionality.

SUMMARY

Illustrative embodiments provide electronic module carriers that include multiple separately-removable sub-carriers. The electronic module carriers illustratively have a standard form factor for insertion with other carriers having the same standard form factor into an electronic equipment chassis.

In one embodiment, an electronic module carrier comprises a carrier housing having a front portion and a rear portion, and a plurality of sub-carriers configured for separate insertion into and removal from respective sub-carrier slots in the front portion of the carrier housing. Each of the sub-carriers is configured to support at least one non-volatile memory module. The electronic module carrier is configured with a designated standard form factor for insertion into and removal from a carrier slot in a front portion of an electronic equipment chassis. For example, the standard form factor may be a 2.5" storage drive form factor. The non-volatile memory modules may comprise respective flash drives or other types of non-volatile memory modules implemented using an M.2 form factor.

Such an arrangement advantageously provides a high degree of flexibility in the configuration of standard form factor storage drives. For example, storage drive capacity can be substantially increased in some embodiments through the inclusion of multiple M.2 flash drives and shared Peripheral Component Interconnect Express (PCIe) interface circuitry in a 2.5" storage drive form factor.

Moreover, illustrative embodiments facilitate the efficient implementation of storage tiering functionality, for example, through the use of different types of non-volatile memory modules having respective different performance characteristics but each implemented using an M.2 form factor.

Furthermore, applications utilizing a storage system comprising one or more of the standard form factor electronic module carriers each having multiple sub-carriers with respective non-volatile memory modules installed thereon can exhibit a significantly faster rebuild time after a failure or other issue than conventional arrangements.

These and other embodiments include, without limitation, apparatus, systems and methods. For example, an exemplary apparatus or system in another embodiment of the invention illustratively comprises an electronic equipment chassis having one or more standard form factor electronic module carriers mounted therein.

DETAILED DESCRIPTION

Illustrative embodiments will be described herein with reference to exemplary sub-carrier, carrier and chassis configurations for electronic equipment such as storage drives. It is to be appreciated, however, that embodiments of the invention are not restricted to the particular illustrative configurations shown. Accordingly, terms such as "electronic module carrier" and "electronic equipment chassis" as used herein are intended to be broadly construed, so as to encompass, for example, a wide variety of other arrangements of storage drives or other types of non-volatile memory modules, possibly arranged with other types of electrical equipment in a common housing of the carrier or chassis.

Figure 1:
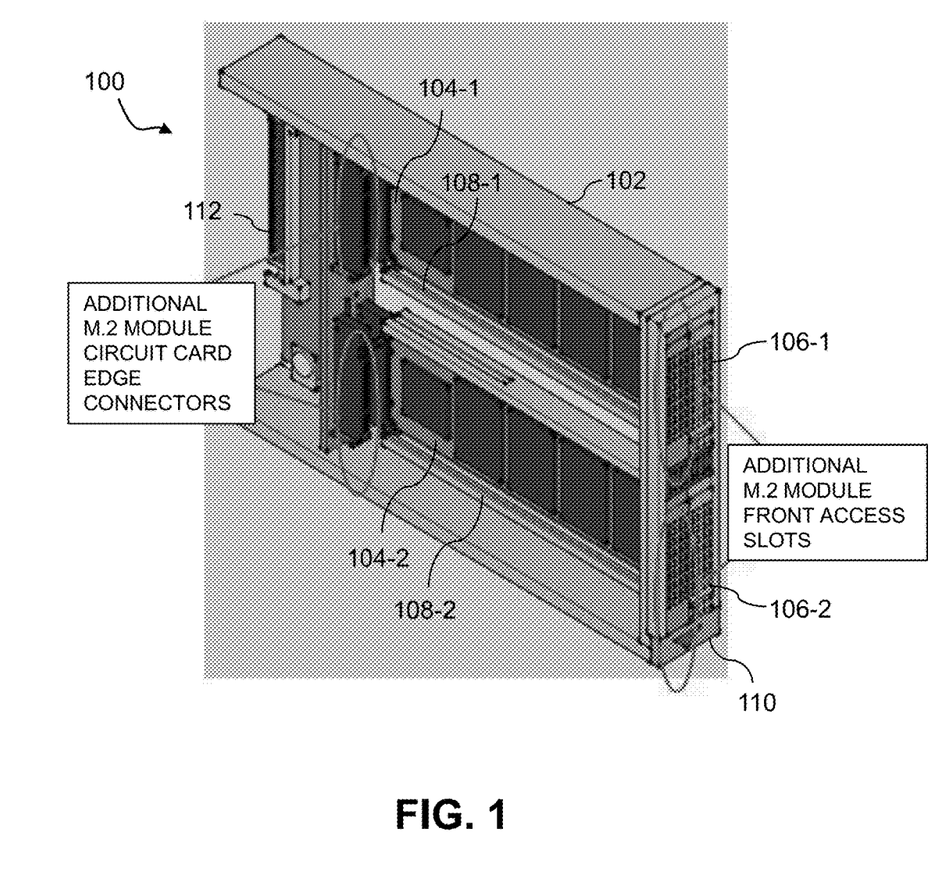
FIG. 1 is a perspective view of an electronic module carrier in a standard form factor and comprising multiple separately-removable sub-carriers each supporting a separate non-volatile memory module in an illustrative embodiment.

FIG. 1 shows an electronic module carrier 100 in accordance with an illustrative embodiment of the present invention. The electronic module carrier 100 comprises a carrier housing 102 having a front portion and a rear portion. The electronic module carrier 100 is in a standard form factor and comprises multiple separately-removable sub-carriers each supporting a separate one of a plurality of non-volatile memory modules 104.

In the arrangement shown in FIG. 1, the electronic module carrier 100 has two separately-removable sub-carriers installed within its carrier housing 102. The two sub-carriers are configured for separate insertion into and removal from respective sub-carrier slots in the front portion of the carrier housing 102. The sub-carrier slots provide respective front access points for the respective sub-carriers at the front portion of the carrier housing 102. The two sub-carriers support respective non-volatile memory modules 104-1 and 104-2, and include respective sub-carrier latching mechanisms 106-1 and 106-2 visible at the front portion of the carrier housing 102. The sub-carrier latching mechanisms 106-1 and 106-2 are coupled to front portions of respective slidable trays 108-1 and 108-2 to which the respective non-volatile memory modules 104-1 and 104-2 are securely attached.

A given one of the sub-carrier latching mechanisms 106 is configured to allow the corresponding one of the slidable trays 108 to be secured in place within the carrier housing 102 when that slidable tray is fully inserted into its corresponding sub-carrier slot in the front portion of the carrier housing 102.

As noted above, the electronic module carrier 100 is configured with a designated standard form factor. Such an arrangement allows the electronic module carrier 100 to be inserted into and removed from a particular carrier slot in a front portion of an electronic equipment chassis. The electronic equipment chassis may further include multiple additional carrier slots supporting multiple additional instances of the electronic module carrier 100 or other types of carriers. For example, the electronic module carrier 100 and a plurality of additional carriers each having the same standard form factor may be configured for separate insertion into and removal from respective carrier slots in the front portion of the electronic equipment chassis. One or more of the additional carriers may have substantially the same configuration as the electronic module carrier 100. An illustrative example of an electronic equipment chassis having multiple slots for accommodating respective multiple carriers having the same standard form factor will be described in more detail below in conjunction with FIG. 8.

The standard form factor of the electronic module carrier 100 in the present embodiment comprises a 2.5" storage drive form factor, although a wide variety of other types of standard form factors may be used. For example, a 3.5" storage drive form factor may be used in alternative embodiments.

The non-volatile memory modules 104 in this embodiment comprise respective M.2 modules, also known as Next Generation Form Factor modules. The modules more particularly comprise respective circuit cards having non-volatile memory circuitry installed thereon. Additional examples of M.2 modules will be described in more detail below in conjunction with FIG. 9. Such modules illustratively provide respective flash drives or other types of solid-state drives (SSDs) based on non-volatile memory.

Other types of non-volatile memory can be used in addition to or in place of flash memory in a given one of the non-volatile memory modules, including by way of example 3D XPoint devices, non-volatile random access memory (NVRAM) devices, or other types of non-volatile memory devices including phase-change RAM (PC-RAM) and magnetic RAM (MRAM). Various combinations of multiple different types of non-volatile memory devices may therefore be used in illustrative embodiments.

The non-volatile memory modules 104 may be configured as respective hot-pluggable modules. The rear portion of the carrier housing 102 illustratively comprises a plurality of circuit card edge connectors configured to mate with corresponding circuit card edges of respective ones of the non-volatile memory modules 104 when their respective sub-carriers are fully inserted into the respective sub-carrier slots.

The term "hot-pluggable module" as used herein is intended to refer to a module that can be safely inserted in or removed from an electronic equipment chassis without turning off the chassis power. Thus, for example, one M.2 storage drive could be inserted into or removed from its corresponding sub-carrier slot of an electronic module carrier of a given powered system without adversely impacting the functionality of other M.2 storage drives or other M.2 modules within that system.

There are two additional sub-carrier slots in the front portion of the carrier housing 102 in the FIG. 1 arrangement. Each such additional sub-carrier slot has a corresponding additional circuit card edge connector for receiving a mating edge of a circuit card of an additional M.2 module.

The electronic module carrier 100 therefore provides a 2-by-2 matrix of equal-sized sub-carrier slots in the front portion of the carrier housing 102 configured for receiving respective ones of four M.2 modules. Other arrangements of sub-carrier slots can be provided in other embodiments. For example, the sub-carrier slots may be more generally arranged in an n-by-m matrix of equal-sized slots wherein n and m are positive integers at least one of which is greater than or equal to two. In the FIG. 1 embodiment, both n and m are equal to two. It is possible to have alternative embodiments in which a given sub-carrier slot is either approximately twice the width or twice the height of the sub-carrier slots of FIG. 1. In such arrangements, the carrier includes two sub-carrier slots rather than four sub-carrier slots, and the sub-carrier slots may be viewed as being arranged in respective 2-by-1 or 1-by-2 matrices. Also, in other embodiments, the sub-carrier slots of a given electronic module carrier need not all be of the same size. Sub-carrier slots of different heights and widths can therefore be provided within the same standard form factor carrier.

It is assumed that the rear portion of the carrier housing 102 further comprises at least one circuit board having installed thereon PCIe interface circuitry adapted for connection to the non-volatile memory modules 104 when their respective sub-carriers are fully inserted into the respective sub-carrier slots. PCIe denotes "Peripheral Component Interconnect Express," and its corresponding specifications, including PCIe 3.0, 3.1 and 4.0, are hereby incorporated by reference herein.

Although communications with the non-volatile memory modules 104 utilize PCIe connections in the present embodiment, other embodiments can use other types of connections. For example, alternative embodiments can use alternative types of interfaces such as Serial Attached SCSI (SAS) and Serial ATA (SATA). Numerous other interfaces and associated communication protocols can be used in other embodiments.

The electronic module carrier 100 further comprises a carrier latching mechanism 110 visible at the front portion of the carrier housing 102. The carrier latching mechanism 110 is coupled to the carrier housing 102 and is configured to allow the electronic module carrier 100 to be secured in place within an electronic equipment chassis when the electronic module carrier 100 is fully inserted into a corresponding carrier slot in a front portion of the electronic equipment chassis, as will be described in more detail below in conjunction with the illustrative embodiment of FIG. 8.

Also included in the electronic module carrier 100 is a rear connector 112 configured to allow the electronic module carrier 100 to be electrically connected to a backplane of an electronic equipment chassis into which it is inserted. The rear connector 112 is illustratively installed on a back edge of the above-noted circuit board comprising the PCIe interface circuitry adapted for connection to the non-volatile memory modules 104 of the electronic module carrier 100. Numerous other types and arrangements of one or more connectors can be used in other embodiments.

As noted above, the electronic module carrier 100 in the view of FIG. 1 includes two additional sub-carrier slots that do not have respective sub-carriers inserted therein. Each such additional sub-carrier slot instead has a removable cover installed therein. The removable cover is illustratively similar in shape and form to the sub-carrier latching mechanisms 106 of the respective inserted sub-carriers.

Figure 2:
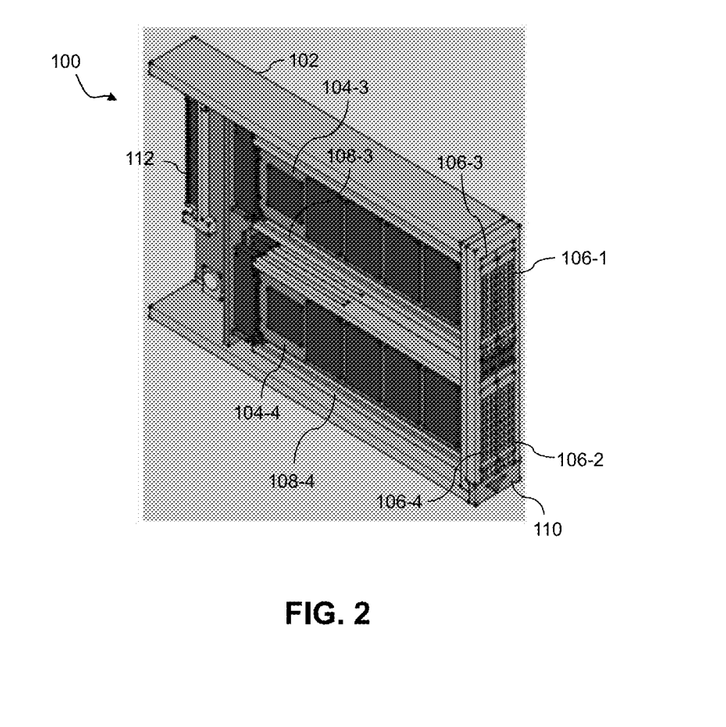
FIG. 2 shows the standard form factor electronic module carrier of FIG. 1 with four separately-removable sub-carriers installed.

FIG. 2 shows the electronic module carrier 100 with two additional sub-carriers inserted into respective ones of the two additional sub-carrier slots in place of the above-noted removable covers. Accordingly, in this view of the electronic module carrier 100, there are four separately-removable sub-carriers installed in respective ones of the four sub-carrier slots in the front portion of the carrier housing 102. The additional sub-carriers comprise respective non-volatile memory modules 104-3 and 104-4, sub-carrier latching mechanisms 106-3 and 106-4, and slidable trays 108-3 and 108-4, all arranged in a manner similar to that previously described for the corresponding elements of the first two sub-carriers previously described in conjunction with the arrangement of FIG. 1.

Figure 3:
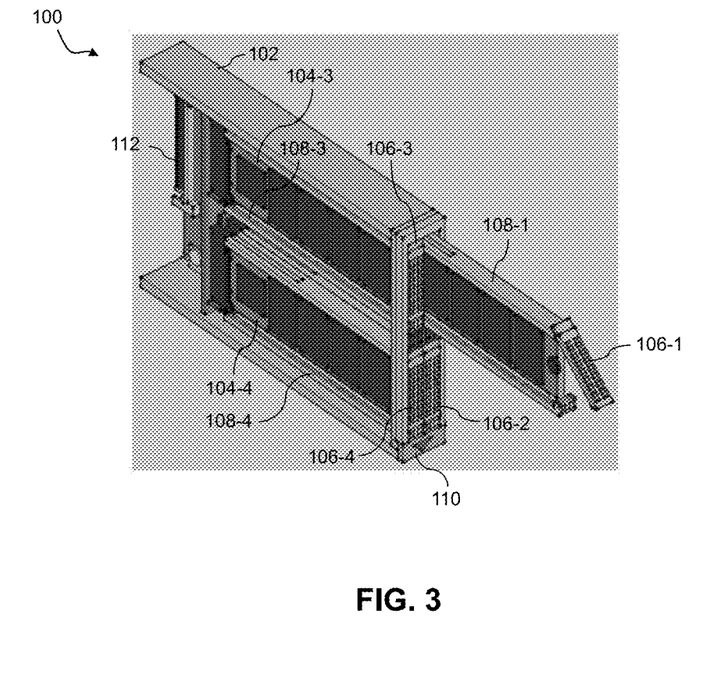
FIG. 3 shows the embodiment of FIG. 2 with one of the four sub-carriers partially removed.

Referring now to FIG. 3, the electronic module carrier 100 of FIG. 2 is shown with one of the four sub-carriers partially removed from its corresponding sub-carrier slot in the front portion of the carrier housing 102. More particularly, the first sub-carrier comprising non-volatile memory module 104-1, sub-carrier latching mechanism 106-1 and slidable tray 108-1 is shown as being partially removed from its corresponding sub-carrier slot.

In order to remove the first sub-carrier from its sub-carrier slot in the front portion of the carrier housing 102, the sub-carrier latching mechanism 106-1 is first moved from its vertical locked position to an open position as illustrated in the figure. The slidable tray 108-1 to which the non-volatile memory module 104-1 is attached is then slidably removed from the sub-carrier slot as illustrated. As part of this removal process, the circuit card edge of the non-volatile memory module 104-1 becomes disengaged from its corresponding circuit card edge connector at the rear portion of the carrier housing 102.

Although the first sub-carrier is shown as being only partially removed from its sub-carrier slot of the carrier housing 102 in this figure, it can be fully removed from its sub-carrier slot of the carrier housing 102. The other sub-carriers can be removed from their respective sub-carrier slots in a similar manner.

Figure 4:
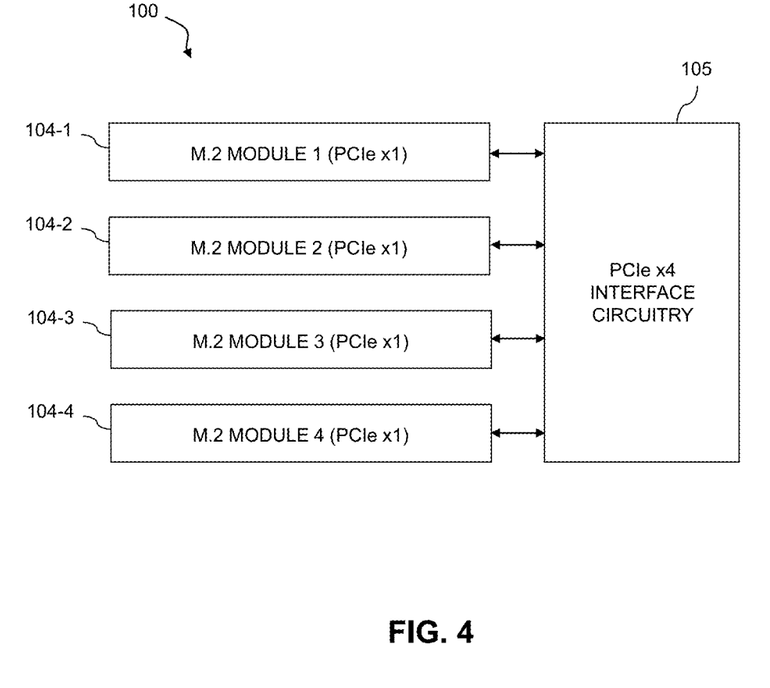
FIG. 4 is a block diagram showing one possible interconnection configuration of the FIG. 2 embodiment.

FIG. 4 illustrates the interconnection of the four non-volatile memory modules 104 with PCIe interface circuitry 105 of the electronic module carrier 100 when the four corresponding sub-carriers are fully inserted in their respective sub-carrier slots. As indicated above, the PCIe interface circuitry 105 is illustratively installed on a circuit board at the rear portion of the carrier housing 102.

In this embodiment, the non-volatile memory modules 104-1, 104-2, 104-3 and 104-4 of the respective sub-carriers more particularly comprise respective M.2 modules each configured for PCIe x1 communication with the PCIe interface circuitry 105 which is more particularly configured as PCIe x4 interface circuitry, where the "x" prefix denotes the number of PCIe lanes. Numerous other interconnection configurations using different numbers and arrangements of PCIe lanes are possible.

One example of an alternative interconnection configuration will now be described in conjunction with FIGS. 5 and 6.

Figure 5:
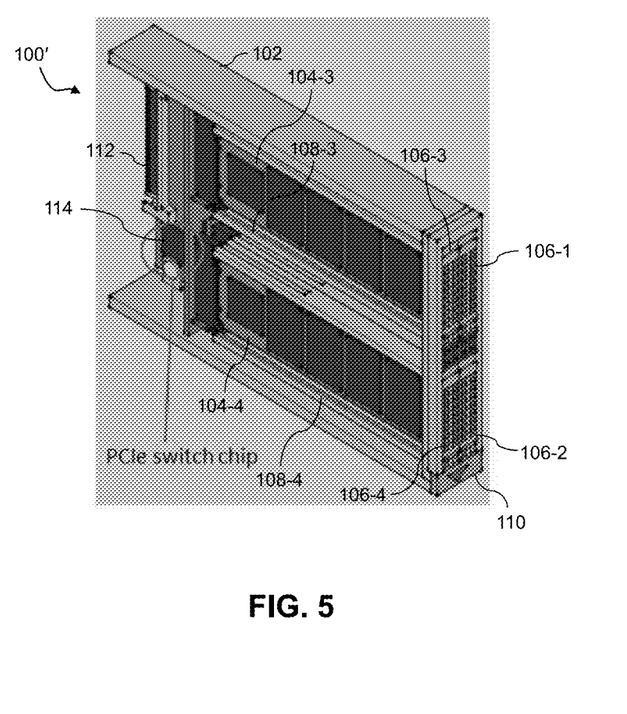
FIG. 5 is a perspective view of a variant of the FIG. 2 embodiment with a PCIe switch installed in the standard form factor electronic module carrier.

As shown in FIG. 5, a variant denoted as electronic module carrier 100' is configured in substantially the same manner as the electronic module carrier 100 previously described in conjunction with FIGS. 1 through 4, but further includes a PCIe switch integrated circuit 114 or "PCIe switch chip" installed on the circuit board at the rear portion of the carrier housing 102 adjacent the rear connector 112.

Figure 6:
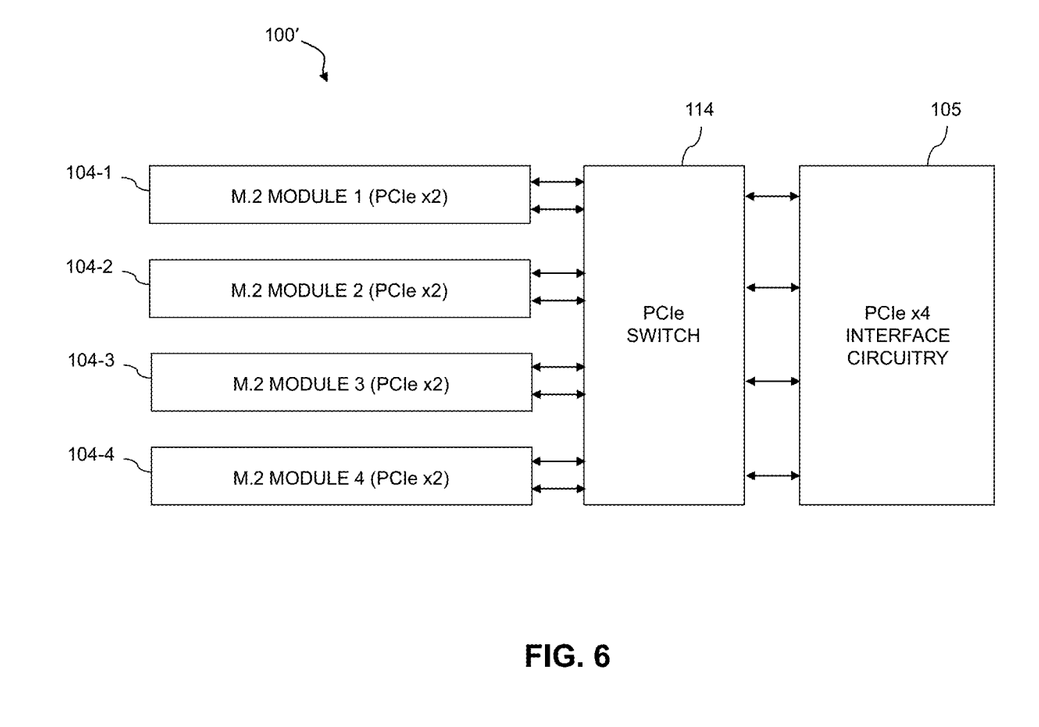
FIG. 6 is a block diagram showing one possible interconnection configuration of the FIG. 5 embodiment.

FIG. 6 illustrates the interconnection of the four non-volatile memory modules 104 with PCIe interface circuitry 105 of the electronic module carrier 100' when the four corresponding sub-carriers are fully inserted in their respective sub-carrier slots.

The PCIe switch integrated circuit 114 illustratively communicates in an upstream direction with a PCIe root complex of a host processor, for example, to support transfer of data between storage drives implemented by the respective non-volatile memory modules 104 and the host processor.

In this embodiment, the non-volatile memory modules 104-1, 104-2, 104-3 and 104-4 of the respective sub-carriers more particularly comprise respective M.2 modules each configured for PCIe x2 communication via the PCIe switch integrated circuit 114 with the PCIe interface circuitry 105 which is again configured as PCIe x4 interface circuitry. This particular interconnection arrangement, like that of FIG. 4 previously described, is presented by way of illustrative example only and should not be considered limiting in any way.

Illustrative embodiments can therefore support dual-port or single port mode flexibility. A given M.2 storage drive may be configured to plug into common PCIe drive slot. Also, an M.2 storage drive in some embodiments can comprise multiple M.2 modules installed on separate sub-carriers. For example, an M.2 storage drive can comprise two or four M.2 modules within a 2.5" storage drive form factor.

In a dual port arrangement, failover functionality is supported. For example, a given such embodiment can include multiple PCIe lanes, such that two hosts could access one M.2 storage drive at the same time using PCIe x2. Thus, if one of the hosts were to fail, the other host can still access the M.2 storage drive.

The electronic module carriers 100 and 100' each include multiple indicator elements implemented in each of the sub-carriers. This is illustrated in more detail in FIG. 7. In this embodiment, the electronic module carrier 100 comprises four fully-inserted sub-carriers as previously described in conjunction with FIG. 2. The fourth sub-carrier comprising non-volatile memory module 104-4, sub-carrier locking mechanism 106-4 and slidable tray 108-4 additionally comprises light-emitting diodes (LEDs) 116-4 arranged at a rear portion of the sub-carrier, at least one light pipe 118-4, and indicator elements 120-4 and 122-4 arranged at a front portion of the sub-carrier.

Figure 7:
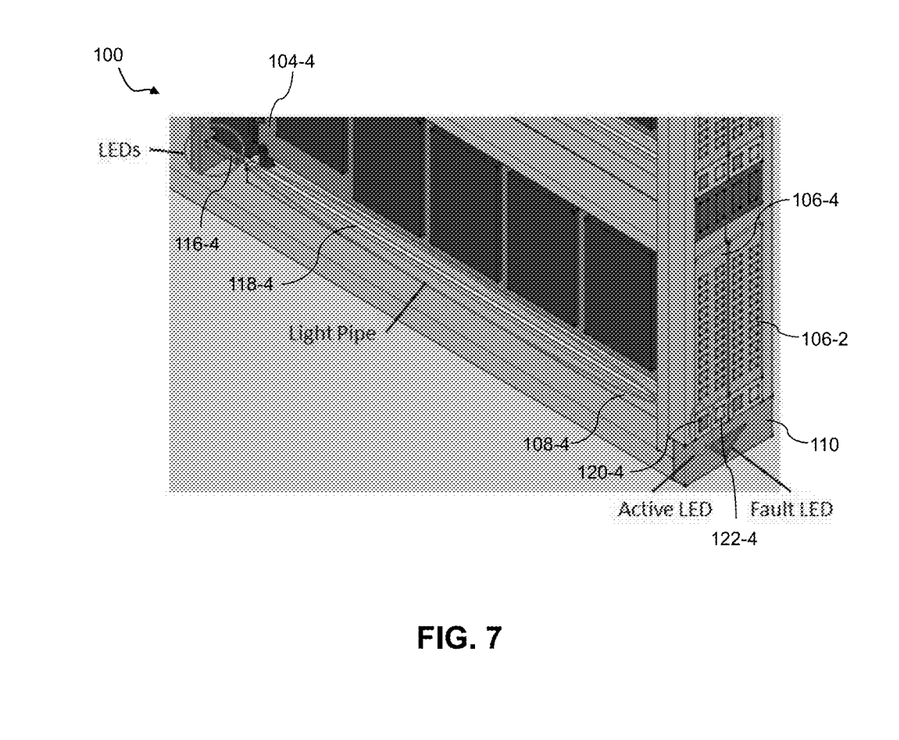
FIG. 7 shows a more detailed view of a portion of the FIG. 2 embodiment showing LEDs and an associated light pipe of one of the separately-removable sub-carriers.

The one or more light pipes 118-4 are configured to couple light from LEDs 116-4 to corresponding ones of the indicator elements 120-4 and 122-4. The indicator elements 120-4 and 122-4 more particularly comprise respective Active LED and Fault LED indicator elements. The state of the Active LED indicator element 120-4 indicates whether or not the corresponding non-volatile memory module 104-4 is in an active condition, such as a condition associated with a host device reading from or writing to the corresponding storage drive, and the state of the Fault LED indicator element 122-4 indicates whether or not the corresponding non-volatile memory module 104-4 is in a fault condition. The indicator elements 120-4 and 122-4 are arranged just below the sub-carrier latching mechanism 106-4 at the front portion of the carrier housing 102 as shown. The other three sub-carriers in this embodiment are assumed to comprise respective arrangements of LEDs, light pipes and indicator elements similar to those described above for the fourth sub-carrier.

In the FIG. 7 embodiment, it is assumed that there is a separate light pipe for each of the indicator elements, although different arrangements are possible. More particularly, in this embodiment, each light pipe illustratively couples light from one of the LEDs to a corresponding one of the indicator elements.

Figure 8:
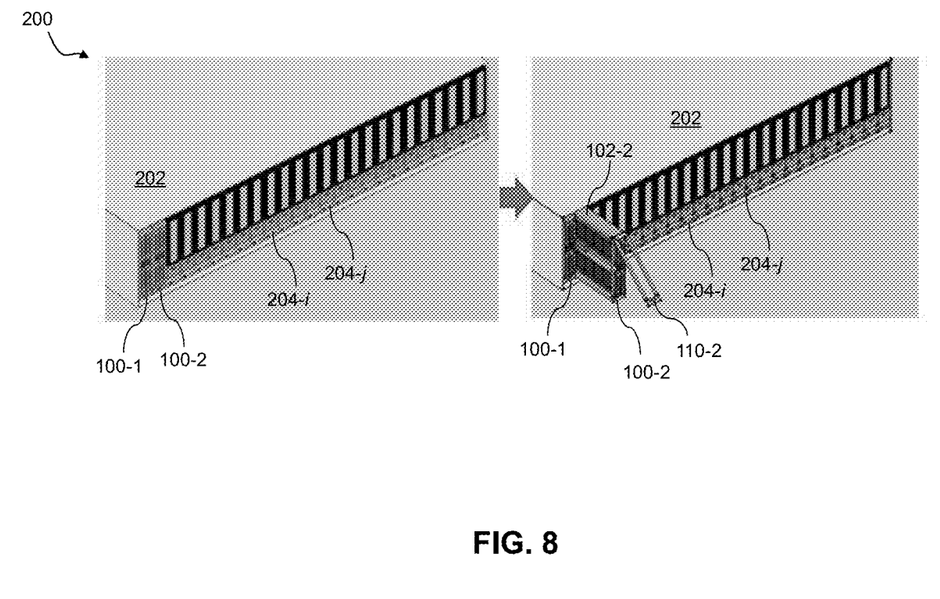
FIG. 8 is a perspective view illustrating installation of multiple instances of the standard form factor electronic module carrier of FIG. 2 in an electronic equipment chassis.

FIG. 8 illustrates the installation of multiple instances of the standard form factor electronic module carrier 100 of FIG. 2 in an electronic equipment chassis 200. The electronic equipment chassis 200 comprises a chassis housing 202 having a front portion and a rear portion. The front portion of the chassis housing 202 comprises a plurality of carrier slots, with the carrier slots being configured for insertion and removal of respective ones of a plurality of carriers each having a standard form factor.

The first two carrier slots of the chassis housing 202 have respective ones of electronic module carriers 100-1 and 100-2 installed therein, as shown at the left side of FIG. 8. Each such electronic module carrier comprises four separately-removable sub-carriers that are fully inserted into respective sub-carrier slots thereof as previously described. The left side of FIG. 8 shows the second electronic module carrier 100-2 partially removed from its carrier slot. This is achieved by first moving carrier latching mechanism 110-2 from its vertical locked position to an open position as illustrated in the figure. The carrier housing 102-2 of the electronic module carrier 100-2 is then slidably removed from the carrier slot as illustrated. As part of this removal process, the rear connector of the electronic module carrier 100-2 becomes disengaged from a corresponding mating connector at the chassis backplane.

Although the second electronic module carrier 100-2 is shown as being only partially removed from its carrier slot of the chassis housing 202 in this figure, it can be fully removed from its carrier slot of the chassis housing 202. The other carriers can be removed from their respective carrier slots in a similar manner.

The additional carrier slots of the chassis housing 202 have respective standard form factor carriers 204 installed therein, including for example standard form factor carriers 204-*i* and 204-*j*. The standard form factor carriers 204 are illustratively 2.5" standard form factor SSDs, but could include other types of storage devices or alternative arrangements of electronic modules, in any combination. For example, at least a subset of the carriers 204 may be implemented as respective 2.5" hard disk drives (HDDs). Also, other types of storage devices having different standard form factors can be used in other embodiments, including, for example, 3.5" SSDs or HDDs, in any combination.

In the FIG. 8 embodiment, the carrier slots in the front portion of the electronic equipment chassis 200 are configured as respective parallel and vertically-oriented carrier slots. However, the carrier slots could be arranged in other ways. For example, in alternative embodiments, horizontally-oriented carrier slots could be used, or various combinations of vertically-oriented and horizontally-oriented carrier slots could be used. Also, as indicated previously, different types of carrier slots having respective different standard form factors could be used in a given embodiment.

The electronic equipment chassis 200 can include additional electrical equipment such as processors, circuit boards, interface cards and power supplies. The particular type of modules and other electronic equipment implemented in the electronic equipment chassis 200, and their manner of interconnection, will vary depending upon the particular needs of the system in which the chassis will be deployed, and the invention is not limited in this regard.

In one possible implementation, the electronic equipment chassis 200 is configured to provide, in addition to multiple hot-pluggable SSDs provided on respective sub-carriers of the electronic module carriers 100-1 and 100-2, multiple host processors, such as Intel EX processors, as well as associated circuit boards illustratively including Redundant Array of Independent Disk (RAID) or RAID-on-chip (ROC) cards and PCIe interface cards. The latter interface cards can provide, for example, 2×Full-Height Full-Length (FHFL)× 16 lane slots and 2×FHFL×8 lane slots, with possible upgrade to support multiple PCIe Gen3 slots arranged in 2×16 and 8×8 configurations. Support for other equipment, such as one or more network switches, can be provided. Also, associated power supplies, heat sinks, interconnects and other related equipment as needed in a given implementation are assumed to be included. Again, these are only examples, and numerous alternative equipment configurations are possible.

Multiple instances of the electronic equipment chassis 200 can be installed in an electronic equipment rack, possibly with at least one additional electronic equipment chassis providing other functionality.

The electronic equipment chassis 200 in the FIG. 8 embodiment illustratively has a 4U rack mount configuration, and thus a height equivalent to four standard units of 1.75" each for a total height of 7.0" although it is to be appreciated that other chassis dimensions could be used in other embodiments. As one example of an alternative chassis arrangement, a 5U rack mount configuration could be used in an embodiment in which 3.5" form factor storage drives are used in place of 2.5" form factor storage drives.

The 4U rack mount configuration utilized in the FIG. 8 embodiment is designed to facilitate mounting of the electronic equipment chassis 200 in an electronic equipment cabinet or other type of electronic equipment rack of standard dimensions. Such an electronic equipment rack can incorporate multiple instances of the electronic equipment chassis 200 or a single instance of electronic equipment chassis 200 in combination with one or more other chassis instances of different types, as required to meet the needs of a particular system.

A wide variety of different types of non-volatile memory modules can be installed on sub-carriers of a standard form factor electronic module carrier in illustrative embodiments. As indicated previously, the non-volatile memory modules 104 in some embodiments comprise respective M.2 modules.

Figure 9:
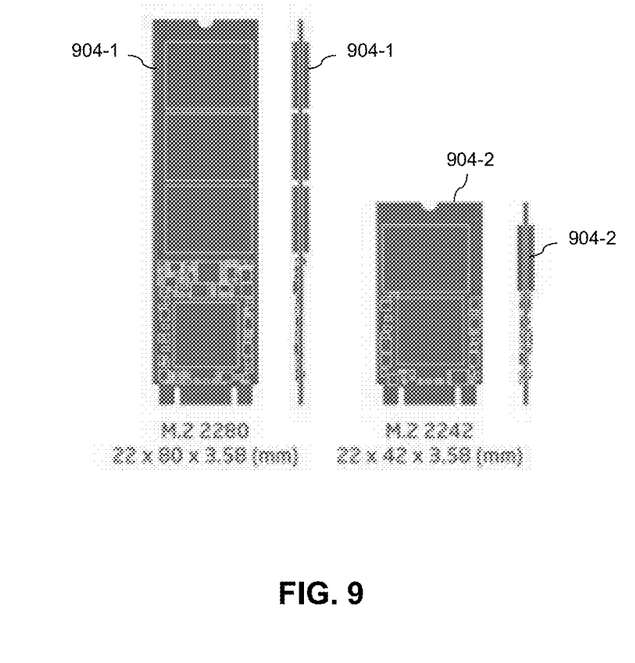
FIG. 9 shows front and side views of each of two example non-volatile memory modules suitable for installation on a sub-carrier of a standard form factor electronic module carrier in illustrative embodiments.

Additional examples of M.2 modules that may be installed on sub-carriers of an electronic module carrier such as electronic module carriers 100 or 100' are shown in FIG. 9. This figure shows front and side views of each of two example non-volatile memory modules denoted 904-1 and 904-2, each of which is suitable for installation on a sub-carrier of a standard form factor electronic module carrier.

The M.2 module 904-1 is a Type 2280 M.2 module having dimensions of 22×80×3.58 millimeters (mm). The M.2 module 904-2 is a Type 2242 M.2 module having dimensions of 22×42×3.58 mm. These and other types of M.2 modules can be installed on one or more of the sub-carriers in the electronic module carrier embodiments described above.

It should be noted in this regard that a given electronic module carrier in another embodiment can include multiple sub-carriers each having an M.2 storage drive installed thereon and one or more additional sub-carriers each having a different type of M.2 module installed thereon to provide a different type of functionality within a given system in which the electronic module carrier is implemented. These different types of M.2 modules are considered "electronic modules" as that term is broadly used herein.

Also, different types of M.2 storage drives can be used in order to implement storage tiering functionality. For example, some embodiments can have multiple distinct storage tiers, each having one or more M.2 storage drives of different types. In such embodiments, different ones of the storage tiers implemented using different types of M.2 storage drives are configured to provide different levels of input-output (IO) performance or other characteristics. For example, different mixes of single-level cell (SLC) or multi-level cell (MLC) type M.2 storage drives can be used to obtain a better balance between reliability and cost, with higher importance or "hot" data being maintained in the higher-reliability M.2 storage drives. These and other embodiments can therefore be configured to move data from one tier to another within a given storage system based on access frequency of the data or other factors.

As a more particular example, a storage system implemented using electronic module carriers as disclosed herein can comprise a fast tier and a capacity tier, with different types of storage devices being used in different ones of the storage tiers. The term "storage device" as used herein is intended to be broadly construed, so as to encompass, for example, flash drives, hard disk drives, solid state drives, hybrid drives or other types of storage devices.

The storage devices utilized in the fast tier are generally significantly faster in terms of read and write access times than the storage devices utilized in the capacity tier. Accordingly, the fast tier in some embodiments is a relatively small storage tier optimized for IO processing speed, while the capacity tier is a relatively large but slower storage tier optimized for storage capacity. Terms such as "fast" and "slow" in this context are relative terms and not intended to denote any particular absolute performance level. However, numerous alternative tiering arrangements may be used, including arrangements with three or more tiers each providing a different level of performance. Such alternative arrangements can include, for example, one or more intermediate storage tiers arranged between the front-end and back-end storage tiers of a multi-tier storage system.

Illustrative embodiments provide significant advantages relative to conventional arrangements.

For example, electronic module carriers implementing multiple sub-carriers as disclosed herein can advantageously provide a high degree of flexibility in the configuration of standard form factor storage drives. Storage drive capacity in some embodiments can be substantially increased through the inclusion of multiple M.2 flash drives and shared PCIe interface circuitry in a 2.5" storage drive form factor.

Also, such embodiments facilitate the implementation of RAID functionality among multiple distinct M.2 storage drives. For example, if four M.2 storage drives are implemented in a single 2.5" storage drive form factor, RAID5 techniques can be applied, leading to improved drive utilization efficiency.

As noted above, illustrative embodiments facilitate the efficient implementation of storage tiering functionality, for example, through the use of different types of non-volatile memory modules having respective different performance characteristics but each implemented using an M.2 form factor.

In addition, applications utilizing a storage system comprising one or more of the standard form factor electronic module carriers each having multiple sub-carriers with respective non-volatile memory modules installed thereon can exhibit a significantly faster rebuild time after a failure or other issue than conventional arrangements.

For example, recovery from failures is facilitated by including multiple separately-removable M.2 storage drives in a 2.5" standard form factor. This avoids lengthy rebuild time situations that might otherwise arise if a conventional large-capacity 2.5" SSD were to fail in its entirety.

The particular configurations of sub-carriers, carriers and chassis in illustrative embodiments can also be varied to suit the needs of a particular system implementation. A given electronic module carrier or associated electronic equipment chassis can include additional equipment such as processors, RAID or ROC cards, PCIe interface cards and switches, and associated power supplies, heat sinks, interconnects and other related equipment, as well as additional or alternative equipment.

It should therefore again be emphasized that the arrangements shown in the illustrative embodiments of FIGS. 1 through 9 are presented by way of example for purposes of illustration only, and alternative embodiments can utilize a wide variety of other types of electronic modules, sub-carriers, carriers and other components. Accordingly, the particular configurations of modules and other components as shown in the figures can be varied in other embodiments. Moreover, the various assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. An electronic module carrier comprising:
   a carrier housing having a front portion and a rear portion; and
   a plurality of sub-carriers configured for separate insertion into and removal from respective sub-carrier slots in the front portion of the carrier housing;
   wherein each of the sub-carriers is configured to support at least one non-volatile memory module; and
   wherein a given one of the sub-carriers comprises:
   a slidable tray configured for attachment of a corresponding one of the non-volatile memory modules thereto; and
   a sub-carrier latching mechanism coupled to a front portion of the slidable tray and configured to allow the slidable tray to be secured in place within the carrier housing when the slidable tray is fully inserted into its corresponding sub-carrier slot in the front portion of the carrier housing.

2. The electronic module carrier of claim 1 wherein the electronic module carrier is configured with a designated standard form factor for insertion into and removal from a carrier slot in a front portion of an electronic equipment chassis.

3. The electronic module carrier of claim 2 wherein the standard form factor comprises a 2.5" storage drive form factor.

4. The electronic module carrier of claim 2 wherein the electronic module carrier and a plurality of additional carriers each having the standard form factor are configured for separate insertion into and removal from respective carrier slots in the front portion of the electronic equipment chassis.

5. The electronic module carrier of claim 1 wherein at least a subset of the non-volatile memory modules comprise respective flash drives.

6. The electronic module carrier of claim 1 wherein at least a subset of the non-volatile memory modules comprise respective M.2 modules.

7. The electronic module carrier of claim 1 wherein at least a subset of the non-volatile memory modules are configured as respective hot-pluggable modules.

8. The electronic module carrier of claim 1 wherein the sub-carrier slots in the front portion of the carrier housing are arranged in an n-by-m matrix of equal-sized slots wherein n and m are positive integers at least one of which is greater than or equal to two.

9. The electronic module carrier of claim 8 wherein both n and m are equal to two.

10. The electronic module carrier of claim 1 wherein the rear portion of the carrier housing comprises a plurality of circuit card edge connectors configured to mate with corresponding circuit card edges of respective ones of the non-volatile memory modules when their respective sub-carriers are fully inserted into the respective sub-carrier slots.

11. The electronic module carrier of claim 1 wherein the rear portion of the carrier housing further comprises at least one circuit board having installed thereon PCIe interface circuitry adapted for connection to the non-volatile memory modules when their respective sub-carriers are fully inserted into the respective sub-carrier slots.

12. The electronic module carrier of claim 11 wherein said at least one circuit board further comprises at least one PCIe switch integrated circuit.

13. The electronic module carrier of claim 1 wherein a given one of the sub-carriers comprises:
at least one light-emitting diode arranged at a rear portion of the sub-carrier;
at least one corresponding indicator element arranged at a front portion of the sub-carrier; and
at least one light pipe configured to couple light from the at least one light-emitting diode to the at least one corresponding indicator element.

14. The electronic module carrier of claim 1 wherein sub-carrier latching mechanisms of respective ones of the sub-carriers of the electronic module carrier when in their respective locked positions are deployed within a frontal periphery of the carrier with the frontal periphery being defined at least in part by a carrier latching mechanism coupled to the front portion of the carrier housing.

15. A method comprising:
configuring an electronic module carrier to include a carrier housing having a front portion and a rear portion; and
providing a plurality of sub-carriers configured for separate insertion into and removal from respective sub-carrier slots in the front portion of the carrier housing;
wherein each of the sub-carriers is configured to support at least one non-volatile memory module; and
wherein a given one of the sub-carriers comprises:
a slidable tray configured for attachment of a corresponding one of the non-volatile memory modules thereto; and
a sub-carrier latching mechanism coupled to a front portion of the slidable tray and configured to allow the slidable tray to be secured in place within the carrier housing when the slidable tray is fully inserted into its corresponding sub-carrier slot in the front portion of the carrier housing.

16. The method of claim 15 further comprising configuring the electronic module carrier with a designated standard form factor for insertion into and removal from a carrier slot in a front portion of an electronic equipment chassis.

17. The method of claim 16 wherein the standard form factor comprises a 2.5" storage drive form factor.

18. An electronic equipment chassis comprising:
a chassis housing having a front portion and a rear portion;
the front portion of the chassis housing comprising a plurality of carrier slots;
the carrier slots being configured for insertion and removal of respective ones of a plurality of carriers each having a standard form factor;
wherein at least one of the carriers comprises an electronic module carrier, the electronic module carrier comprising:
a carrier housing having a front portion and a rear portion; and
a plurality of sub-carriers configured for separate insertion into and removal from respective sub-carrier slots in the front portion of the carrier housing;
wherein each of the sub-carriers is configured to support at least one non-volatile memory module; and
wherein a given one of the sub-carriers comprises:
a slidable tray configured for attachment of a corresponding one of the non-volatile memory modules thereto; and
a sub-carrier latching mechanism coupled to a front portion of the slidable tray and configured to allow the slidable tray to be secured in place within the carrier housing when the slidable tray is fully inserted into its corresponding sub-carrier slot in the front portion of the carrier housing.

19. The electronic equipment chassis of claim 18 wherein the carrier slots in the front portion of the electronic equipment chassis are configured as respective parallel and vertically-oriented carrier slots.

20. An electronic equipment rack comprising at least one electronic equipment chassis as recited in claim 18.

* * * * *